US008709936B2

(12) United States Patent
Volant et al.

(10) Patent No.: US 8,709,936 B2
(45) Date of Patent: Apr. 29, 2014

(54) METHOD AND STRUCTURE OF FORMING BACKSIDE THROUGH SILICON VIA CONNECTIONS

(75) Inventors: Richard P. Volant, New Fairfield, CT (US); Mukta G. Farooq, Hopewell Junction, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/562,927

(22) Filed: Jul. 31, 2012

(65) Prior Publication Data

US 2014/0035109 A1    Feb. 6, 2014

(51) Int. Cl.
*H01L 21/00* (2006.01)
(52) U.S. Cl.
USPC .................. 438/614; 438/667; 438/638
(58) Field of Classification Search
USPC .......................... 438/614, 667, 638
See application file for complete search history.

(56) References Cited

U.S. PATENT DOCUMENTS

| 7,928,534 | B2 | 4/2011 | Hsu et al. | |
|---|---|---|---|---|
| 7,956,442 | B2 | 6/2011 | Hsu et al. | |
| 8,492,252 | B2* | 7/2013 | Farooq et al. | 438/525 |
| 8,492,878 | B2* | 7/2013 | Farooq et al. | 257/621 |
| 2009/0140381 | A1 | 6/2009 | Lin et al. | |
| 2010/0276787 | A1 | 11/2010 | Yu et al. | |

OTHER PUBLICATIONS

Vempati Srinivasa Rao, et al., "TSV interposer fabrication for 3D IC packaging," Electronics Packaging Technology Conference, 2009. EPTC '09. 11th, vol., no., pp. 431-437, Dec. 9-11, 2009.
H.Y. Li, et al., "Redistribution layer (RDL) process development and improvement for 3D interposer," Electronics Packaging Technology Conference (EPTC), 2011 IEEE 13th, vol., no., pp. 341-344, Dec. 7-9, 2011.
R. El Farhane, et al., "A successful implementation of dual damascene architecture to copper TSV for 3D high density applications," 3D Systems Integration Conference (3DIC), 2010 IEEE International, vol., no., pp. 1-4, Nov. 16-18, 2010.

* cited by examiner

*Primary Examiner* — Laura Menz
(74) *Attorney, Agent, or Firm* — Kevin B. Anderson; Catherine Ivers (57) ABSTRACT

A method, and the resulting structure, to make a thinned substrate with backside redistribution wiring connected to through silicon vias of varying height. The method includes thinning a backside of a substrate to expose through silicon vias. Then a thick insulator stack, including an etch stop layer, is deposited and planarized. With a planar insulating surface in place, openings in the insulator stack can be formed by etching. The etch stop layer in the dielectric stack accommodates the differing heights vias. The etch stop is removed and a conductor having a liner is formed in the opening. The method gives a unique structure in which a liner around the bottom of the through silicon via remains in tact. Thus, the liner of the via and a liner of the conductor meet to form a double liner at the via/conductor junction.

8 Claims, 8 Drawing Sheets

METHOD AND STRUCTURE OF FORMING BACKSIDE THROUGH SILICON VIA CONNECTIONS

BACKGROUND OF THE INVENTION

1. Field of the Invention

The present invention generally relates to microelectronic structures, and more particularly to through silicon vias (TSVs), and even more preferably to the formation of TSVs connected to conducting structures.

2. Background and Description of Related Art

In the past, microelectronic devices, including integrated circuits (ICs), have increased performance by shrinking device features, thereby creating a higher density of circuits on a substrate. To continue the quest for increased performance, in additional the described two-dimensional (2D) shrinking, manufactures are stacking substrates to gain density in a third dimension (i.e. 3D-ICs). To enable the 3D efforts, TSVs are used to connect a first substrate to bond pads, interposers, redistribution layers, a second substrate, or other conductive features.

TSVs extend from within an integrated circuit built on/in a first substrate to the backside of the first substrate. Initially, the TSVs end within the substrate. The substrate is thinned to expose the TSVs so they may subsequently be connected to the bond pads, interposer, redistribution layer, second substrate or the like. However, during the thinning/exposure process(es) the substrate may form a fissure or break. This is particularly true if the TSVs are different heights. And even if the substrate is not damaged, the current process and resulting structure are prone to shorting or leakage.

Therefore, a robust process is needed to accommodate TSVs of varying heights. This invention provides a novel process and resulting structure to accommodate TSVs of varying heights and is also applicable to TSVs having uniform heights.

SUMMARY

The general principal of the present invention is a method, and the resulting structure, to make a connection between one or more conductors and vias. The method is particularly applicable to through silicon vias having different heights.

The method includes thinning a backside of a substrate to expose through silicon vias. Then a thick insulator stack, preferably including an etch stop layer, is deposited and planarized. With a planar insulating surface in place, openings in the insulator stack can be formed by etching. The etch stop layer in the dielectric stack accommodates the differing heights vias. The etch stop is removed and a conductor having a liner is formed in the opening.

The method gives a unique structure in which a liner around the bottom of the through silicon via remains in tact. Thus, the liner of the via and a liner of the conductor meet to form a double liner at the via/conductor junction.

One aspect of the invention is a structure which includes a substrate having a backside; a first through silicon via having sides; a bottom surface; and a first height protruding from the backside of the substrate. The structure further includes a first conductor facing the backside of the substrate and in electrical contact with the first silicon via. In the structure, a first via liner encapsulates the sides and the bottom surface of the first through silicon via.

A further aspect of the invention is a structure which includes a conductor having a conductor fill material and having a conductor liner covering at least one side of the conductor. The structure also includes a via having a via fill material and having a via liner covering at least one side of the via. In the structure, the at least one side of the via covered by the via liner is facing and in direct contact with the at least one side of the conductor covered by the wiring liner.

Another aspect of the invention is a method of forming an integrated circuit substrate connected to a conductor, the method includes providing a substrate having a first through silicon via within the substrate wherein the substrate has a backside; exposing, through the backside of the substrate, an end of the first through silicon via; forming an insulator over the backside of the substrate and the end of the first through silicon via; forming an opening in the insulator over the end of the first through silicon via; and forming a conductor in the opening.

BRIEF DESCRIPTION OF THE DRAWINGS

Other objects, aspects and advantages of the invention will become obvious in combination with the description of accompanying drawings, wherein the same number represents the same or similar parts in all figures.

DETAILED DESCRIPTION OF EMBODIMENTS

Embodiments of methods of making a conductor in contact with a through silicon via of the present invention are described in conjunction with FIGS. 1-6. Various embodiments of the structure of the present invention are described in conjunction with FIGS. 6-8.

Figure 1:
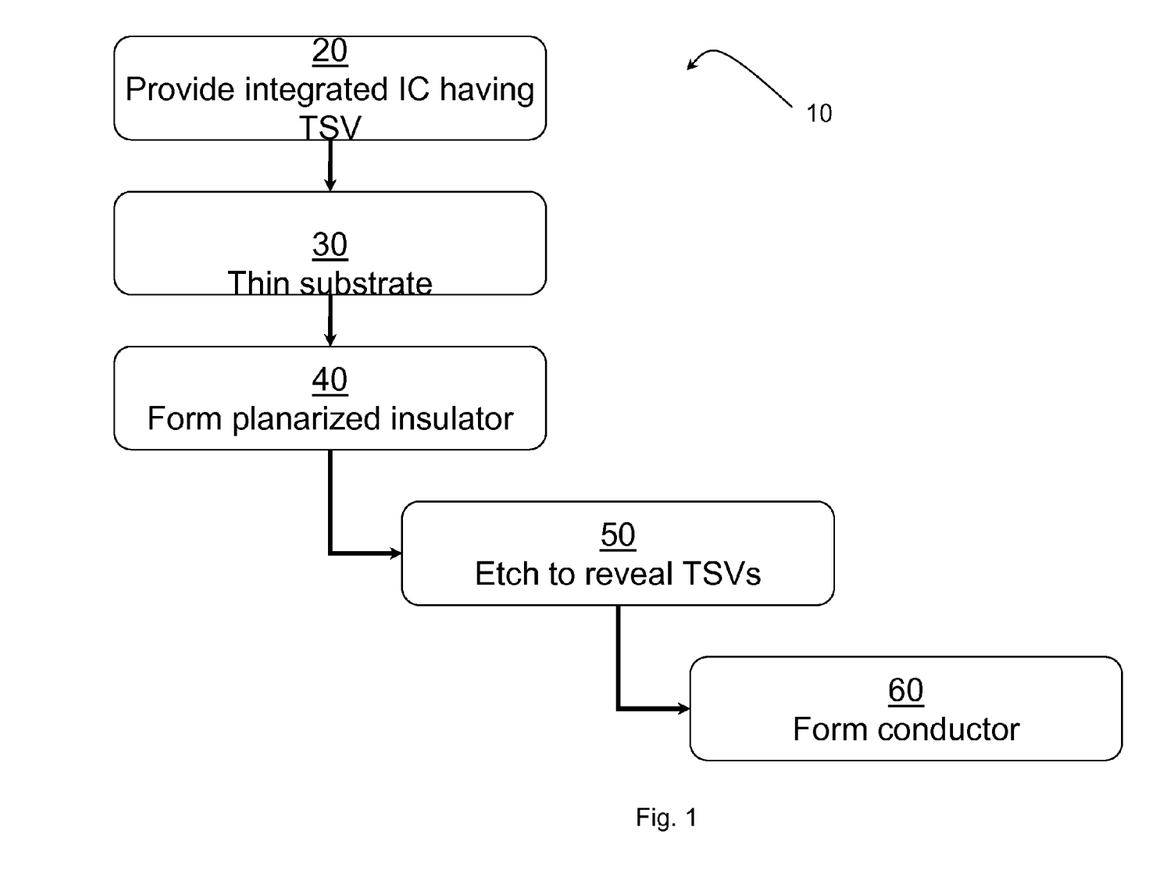
FIG. 1 illustrates a flow chart for a method of making the conductor/via structure according to an embodiment of the present invention.

FIG. 1 illustrates a flow chart 10 of the steps of a method to create a conductor in contact with a through silicon via or via(s). The method starts at step 20 by providing an integrated circuit (IC) having one or more through silicon vias (TSV) within a substrate. Next, step 30 thins the substrate so that the TSVs are exposed, and preferably protruding, from the backside of the substrate. In step 40, an insulator stack is formed on the backside of the substrate and over the exposed TSVs. The insulator stack is planarized. In step 50, the insulator stack is patterned an etch to form and opening which reveals the TSV(s). Finally, in step 60, a conductor is formed in the opening and in contact with the TSV(s). The steps are discussed in more detail in the following paragraphs.

Figure 2:
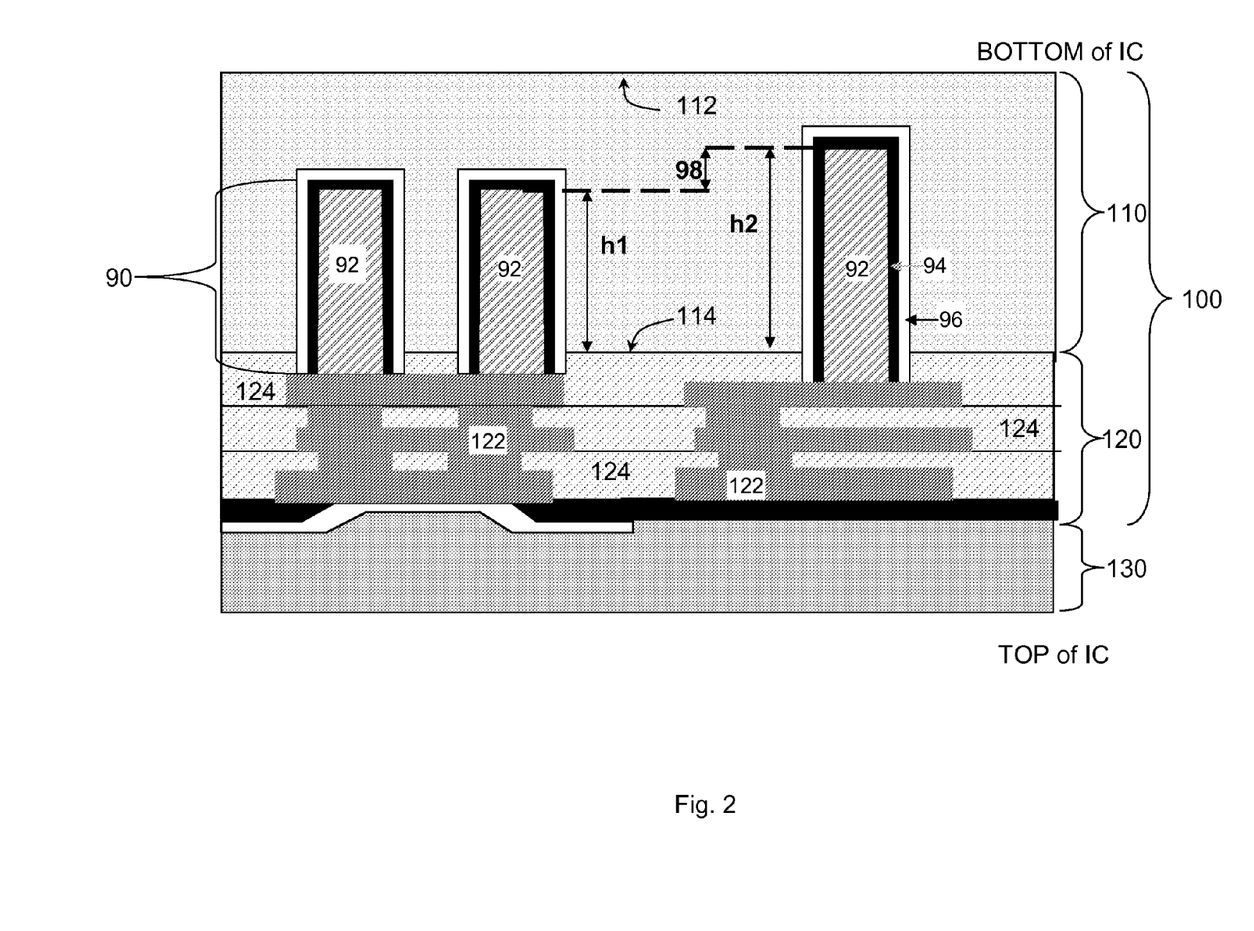
FIG. 2 illustrates an embodiment of an integrated circuit having TSVs of different heights according to a step in the method of the present invention.

FIG. 2 illustrates a starting point of the method: providing an integrated circuit (IC) 100. In FIG. 2, the IC is shown upside down, such that the bottom the IC having the substrate 110 is at the top of the page, and the top to of the IC having the interconnect levels 120 is at the bottom of the page. FIG. 2 also shows an optional 130 glass handling layer and 135 adhesive layer. Those skilled in the art realize that other layers of features could be in addition to or en lieu of the glass handling layer.

Still referring to FIG. 2, the substrate 110 is preferably a semiconductor substrate and can include semiconductor on insulator substrates. In a preferred embodiment the semiconductor is silicon. The substrate has a back-side 112 and a front-side 114. The transistors of the IC are in and/or on the front-side 114 of the substrate 110, but our not shown in FIG. 2. The transistors are in electrical communication with the interconnects levels 120 of the IC.

The interconnect levels 120 comprise dielectrics 124 and metals 122 levels. Preferably, one or more of the dielectrics 124 of the interconnect levels 120 comprises a low k dielectric. Low k dielectrics include dielectrics having a dielectric constant less than 3.9, preferably less than 3.2, and more preferably 2.2 or less. Low k dielectrics include, but are note limited to, halogen doped silicon oxides, carbon doped silicon oxides, and porous silicon carbon doped oxides. Preferably, the metal 122 levels comprise copper. One or more of the metal 122 levels of the interconnect 120 are connected to one or more through silicon vias (TSVs) 90. In FIG. 2, the TSVs are connects to the lowest or first metal level, but a TSV could be connected to other metal levels, and each TSV could be connected to the same or different metal levels.

Continuing with FIG. 2, three TSVs are shown. Each TSV has a fill material 92, a via liner 94 and a via insulator 96. Preferably, the via fill material 92 is a conductor and in particular, comprises copper. The via liner 94 is preferably a conductive material, it may also optionally function as a diffusion barrier. In a preferred embodiment, the via liner 94 is a dual layer of Ta and TaN with the Ta being between the copper and the TaN. The via insulator 96 electrically isolates the TSV 90 from the substrate 110. In a preferred embodiment the via insulator includes a silicon oxide.

Still referring to FIG. 2, the TSVs 90 are embedded in the substrate 110. Each TSV has a height measured from the top 114 of the substrate to the bottom surface of the via defined by the via fill 92/via liner 94 interface. FIG. 2 shows an example in which one of the vias has a first height h1 whereas another via has a second height h2 which is different from the first height. The difference in TSV height is designated by reference numeral 98 in FIG. 2 and can be from about 0.5 micron to about 10 microns and ranges therebetween. The height difference can be intentional or more likely is a result of process variation while etching to form the TSVs 90 in the substrate 110.

Figure 3:
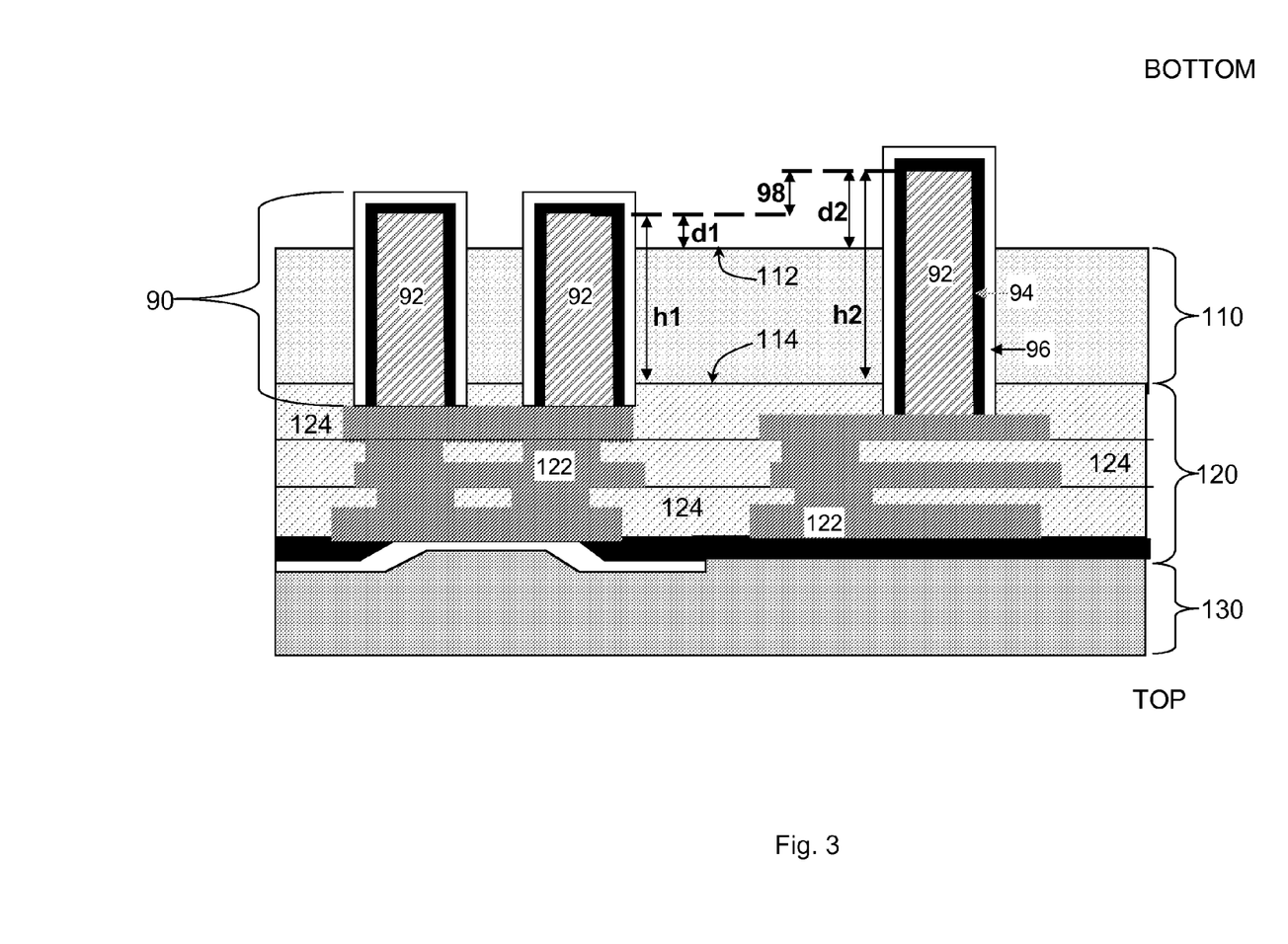
FIG. 3 illustrates an embodiment of an integrated circuit after thinning the backside of the substrate to form protruding TSVs according to an embodiment of the present invention.

Referring to FIG. 3, the substrate 110 has been thinned such that the backside 112 of the substrate 110 is below the bottom surface of the TSVs 90. Notice that the height difference 98, if any, of the TSVs remains intact after the substrate 110 thinning. The substrate 110 thinning process is a combination of grinding/polishing, cleaning and reactive ion etching (RIE). The TSVs 90 now protrude from the back-side 112 of the substrate 110 a distance, d. Note, for the TSV having the lesser height, h1, it's distance, d1, from the backs-side 112 of the substrate 110 is lesser than the distance, d2, protruded by the taller TSV having height h2. A typical protruding distance, d, can be from about 0.5 micron to about 10 microns and ranges there between.

Figure 4:
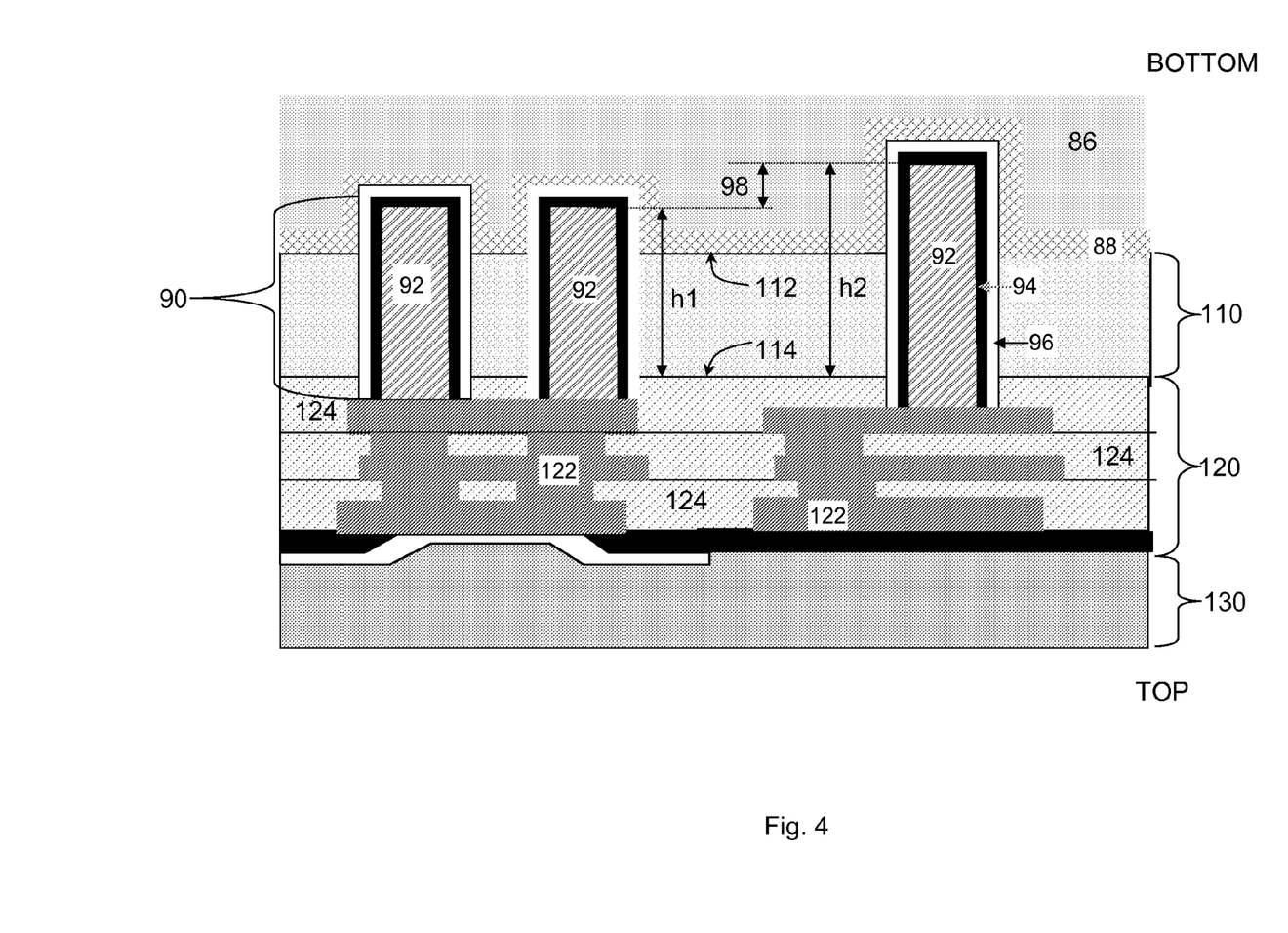
FIG. 4 illustrates an embodiment of an integrated circuit after forming a planarized insulating layer according to an embodiment of the present invention.

Referring to FIG. 4, an insulator stack comprising an etch stop layer 88 and insulator 86 is deposited. Note that the etch stop layer 88 substantially conforms with the protruding TSVs 90 while the insulator 86 fills the area between the protruding TSVs 90. The insulator 88 is to thickness such that at all points, the insulator thickness is greater than d2 (the largest distance a TSV protrudes above the thinned back-side 112 of the substrate 110). The etch stop 88 layer is a nitrogen containing dielectric layer. In a preferred embodiment the etch stop layer 88 is silicon nitride. The etch stop 88 may include multiple layers of films of the same or different type. Preferably the etch stop layer 88 is from about 500 A to about 1 um thick and ranges therebetween. The insulator 86 can be any dielectric layer that etches more rapidly than the etch stop layer 88. In a preferred embodiment the insulator layer 86 silicon dioxide. The insulator layer 86 may include multiple layers of films of the same or different type. Preferably the insulator layer 88 is from about 5 um to about 20 um thick and ranges therebetween. In FIG. 4, the insulator stack has been planarized either by chemical mechanical polishing or an etch back.

Figure 5:
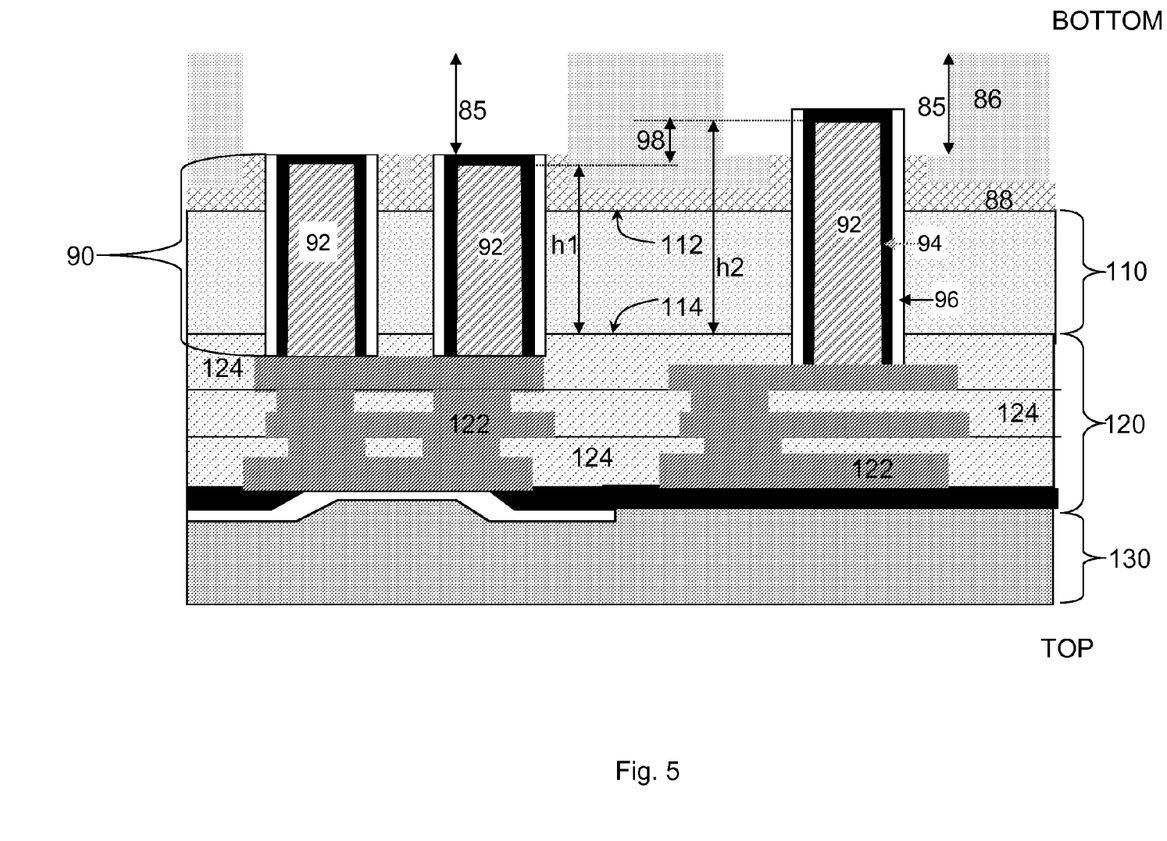
FIG. 5 illustrates an embodiment of an integrated circuit after etching to reveal TSVs according to the embodiment of the present invention.

Referring to FIG. 5, with a planarized surface in place, the lithography and etching to form openings in the insulator can progress. Here, openings 87 formed in the insulator stack reveal the via liner 94, but leave the via liner 94 in place over the bottom surface of the via 90. The height 85 of the openings is substantially the same regardless of TSV heights (h1 and h2) and TSV protrusion distance (d1 or d2) from the thinned substrate back-side 112. Thus, as is shown in the TSV on the left of FIG. 5, some TSVs can be just revealed by the opening, while other TSVs, on the right of FIG. 5, also exposes the part of the sides of the TSVs.

Figure 6:
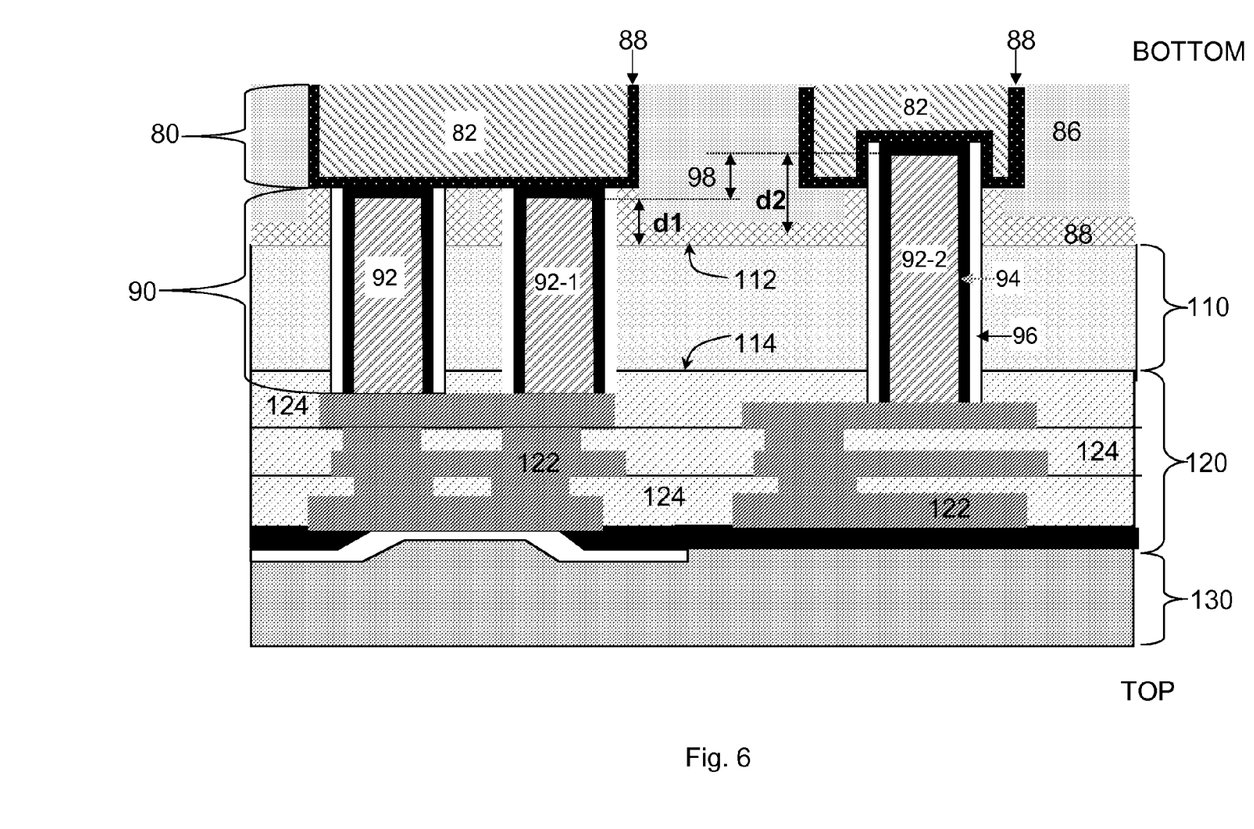
FIG. 6 illustrates forming a planarized conductor in electrical contact with the TSVs according to an embodiment of the present invention.

Referring to FIG. 6, the openings 87 are filled and co-planarized to form a conductor 80. The conductor includes a conductor liner 88 and a conductor fill 82. In a preferred embodiment the conductor liner is TaN/Ta and the conductor fill 82 contains copper. However, other combinations are possible. While FIG. 6 only shows a single conductor 80 layer, other conductor layers can be built above conductor 80. In one embodiment the conductor 80 is a redistribution line. In another embodiment the conductor 80 can be, by way of example and not limitation, a capture pad for packaging interconnect (i.e. a C4 ball or wirebond).

FIG. 6 shows an embodiment of a final structure of the present invention. Unique features of the final structure include that the TSVs 90 retain their height difference 98 after formation of the conductor 80. As such, the TSVs of different heights also retain their different distances from the back-side 112 of substrate 110 to the bottom surface (interface between via fill 92 and via liner 94). Another unique feature is that there is a double liner where the conductor 80 and the TSV 90 meet. The double liner feature can be seen more clearly in FIG. 7.

Figure 7:
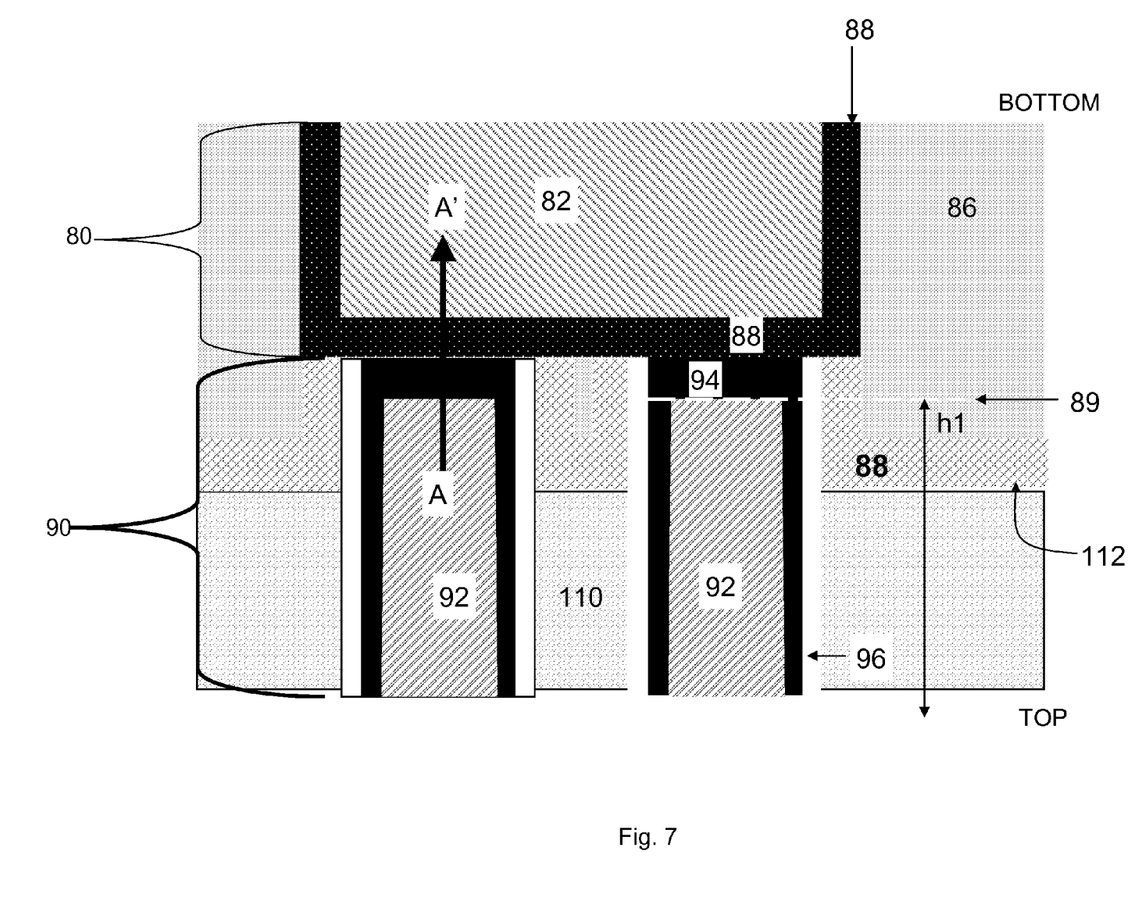
FIG. 7 illustrates an enlarged view of the conductor making electrical contact with a TSV according to an embodiment of the present invention.

Referring to FIG. 7, an enlargement of a portion of FIG. 6 is shown. Here, it can be clearly sent that the bottom surface of the via 90 retains it via liner 94 and that it is in contact with the conductor liner 88. The points A-A' of FIG. 7 are further enlarged in FIG. 8 showing the preferred embodiment of the double liner.

Figure 8:
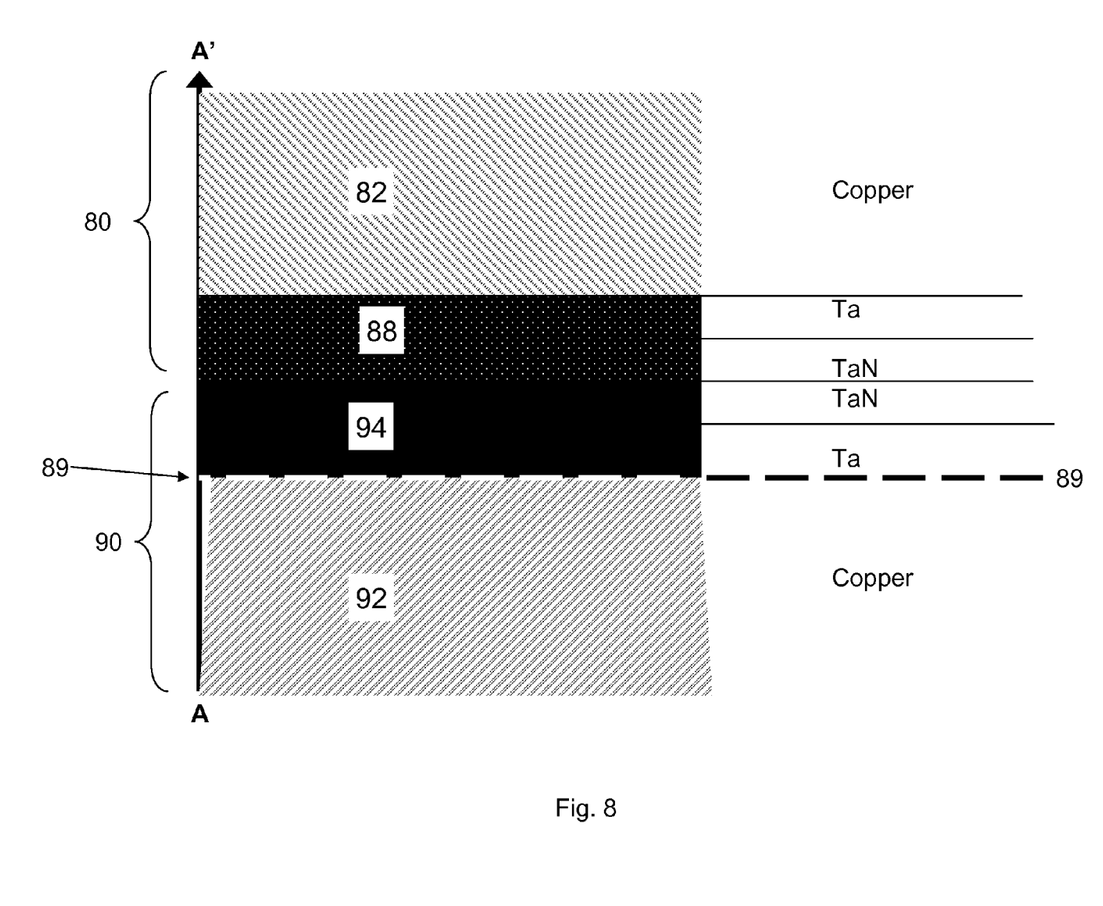
FIG. 8 illustrates the film stack along line A-A' of FIG. 7 according to an embodiment of the present invention.

Referring to FIG. 8, on the left hand side of are the conductor 80, conductor fill 82, conductor liner 88, via liner 94 and via fill 92 as depicted in FIG. 7. On the right hand side of FIG. 8, is the preferred embodiment wherein the conductor fill 82 contains copper, the conductor liner 88 is Ta film on at TaN film, the via liner 94 is in this inverted view, a TaN film on a Ta film, and the via fill 92 contains copper. The advantage of a double line layer is that a diffusion barrier remains in place throughout all processing; therefore, the substrate is never exposed to a highly diffusive metal, such as copper.

Other advantages of the present invention include that the method does not require any polishing of the TSVs which means there is no smearing of the via fill material. Instead, the TSVs remain encapsulated by the via liner. Furthermore, by not polishing the TSVs cracking of the substrate is minimized, if not eliminated completely. A further advantage is that multiple redistribution levels are enabled by planarized conductor. Conductors, such as redistribution layers (RDL) Yet another advantage of the present invention is that incoming substrates with varying TSV heights can be successfully processed. Finally, while the present invention is explained in conjunction with the preferred embodiment of copper TSVs, it can work equally well with other conjunction with other TSV materials, such as, but not limited to tungsten and it's liners (Ti/TiN).

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadcast interpretation so as to encompass all such modifications and equivalent structures and functions.

What is claimed is:

1. A method of forming an integrated circuit substrate connected to a conductor, the method comprising:
   providing a substrate having a first through silicon via and a second through silicon via within the substrate, wherein the substrate has a backside and the first through silicon via has a first height and the second through silicon via has a second height, the first height greater than the second height;
   exposing, through the backside of the substrate, an end of the first through silicon via and an end of the second through silicon via;
   forming an insulator over the backside of the substrate, the end of the first through silicon via and the end of the second through silicon via;
   forming a first opening and a second opening in the insulator, wherein the first opening exposes a bottom surface and a side of the first through silicon via and the second opening exposes a bottom surface of the second through silicon via; and
   forming a first conductor in the first opening and second conductor in the second opening, where in the first conductor contacts the bottom surface and the side of the first through silicon via and the second conductor contacts the bottom surface of the second through silicon via.

2. The method of claim 1, wherein forming an insulator further comprises forming an etch stop layer adjacent to the backside of the substrate and a dielectric layer adjacent the etch stop layer.

3. The method of claim 2, wherein the etch stop layer is a dielectric layer containing nitrogen.

4. The method of claim 2, wherein the dielectric layer is an oxide layer.

5. The method of claim 2, further comprising planarizing the dielectric layer.

6. The method of claim 2, wherein forming a first opening and a second opening in the insulator layer includes etching the dielectric layer to the etch stop layer, removing the etch stop layer and exposing the bottom surface and the side of the first through silicon via and the bottom surface of the second through silicon via.

7. The method of claim 1, wherein exposing bottom surface and a side of the first through silicon via and a bottom surface of the second through silicon via includes removing a via insulator and exposing a via liner.

8. The method of claim 1, wherein forming a conductor in the first opening and the second opening further comprises forming a conductor liner in contact with said via liner.

* * * * *